United States Patent [19]

Tamai et al.

[11] Patent Number: 5,196,506
[45] Date of Patent: Mar. 23, 1993

[54] POLYMIDE

[75] Inventors: Shoji Tamai, Kanagawa; Masahiro Ohta, Fukuoka; Akihiro Yamaguchi, Kanagawa, all of Japan

[73] Assignee: Mitsui Toatsu Chemicals, Inc., Tokyo, Japan

[21] Appl. No.: 914,016

[22] Filed: Jul. 15, 1992

Related U.S. Application Data

[63] Continuation of Ser. No. 601,373, Oct. 23, 1990, abandoned.

[30] Foreign Application Priority Data

Nov. 17, 1989 [JP] Japan .................................. 1-297518

[51] Int. Cl.$^5$ ..................... C08G 69/26; C08G 73/10; C08G 8/02; C08G 14/00
[52] U.S. Cl. ................................. 528/353; 528/125; 528/126; 528/128; 528/170; 528/171; 528/172; 528/173; 528/176; 528/183; 528/185; 528/188; 528/220; 528/229; 528/350; 528/352
[58] Field of Search .............. 528/125, 126, 128, 170, 528/171, 172, 173, 176, 183, 185, 188, 220, 229, 350, 352, 353

[56] References Cited

U.S. PATENT DOCUMENTS

| | | | |
|---|---|---|---|
| 3,959,350 | 5/1976 | Rogers | 528/353 |
| 4,925,915 | 5/1990 | Mueller et al. | 528/353 |
| 4,925,916 | 5/1990 | Harris et al. | 528/185 |
| 4,996,293 | 2/1991 | Tsuyoshi | 528/353 |
| 5,032,667 | 7/1991 | Harris | 528/172 |
| 5,037,949 | 8/1991 | Mueller et al. | 528/353 |
| 5,055,550 | 10/1991 | Mueller et al. | 528/353 |
| 5,061,784 | 10/1991 | Mueller et al. | 528/353 |

FOREIGN PATENT DOCUMENTS 200204 11/1986 European Pat. Off. .
2199586 7/1988 United Kingdom .

OTHER PUBLICATIONS

CA 100:139807v JP 58 180,531 Oct. 22, 1983.

*Primary Examiner*—John Kight, III
*Assistant Examiner*—P. Hampton-Hightower
*Attorney, Agent, or Firm*—Burns, Doane, Swecker & Mathis

[57] ABSTRACT

A polyimide having a high heat-resistance good processability and recurring structural units of the formula (I):

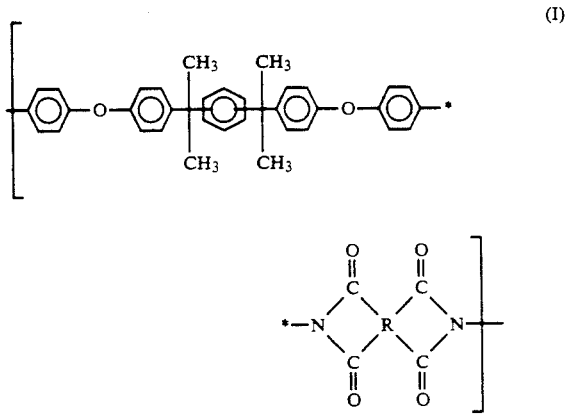

wherein R is a tetravalent radical selected from the group consisting of an aliphatic radical having at least two carbon atoms, alicyclic radical, monocyclic aromatic radical, fused polycyclic aromatic radical and polycyclic aromatic radical bonded through a direct bond or a bridge member.

6 Claims, 2 Drawing Sheets

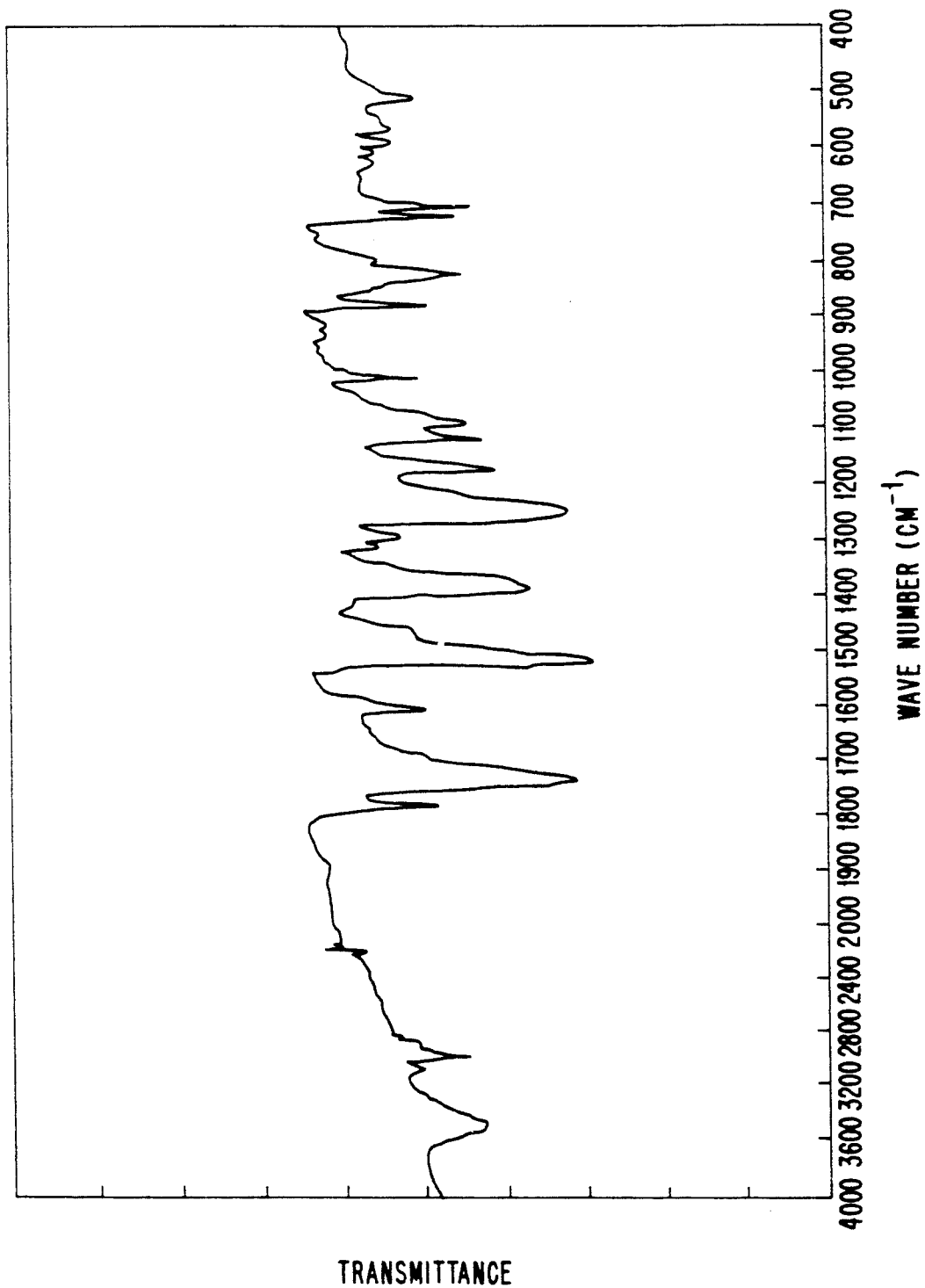

POLYMIDE

This application is a continuation, of application Ser. No. 07/601,373, filed Oct. 23, 1990, now abandoned.

BACKGROUND OF THE INVENTION

1. Field of the Invention

The present invention relates to a novel polyimide, and particularly relates to a polyimide having a high heat-resistance and good processability. 2. Description of the Prior Art A polyimide obtained by reacting tetracarboxylic acid dianhydride and diamine compound has conventionally been used in various fields due to excellent properties and good thermal-resistance, and is expected to be applied to various fields where high-temperature stability is required.

Many kinds of polymide which have conventionally been developed exhibit excellent properties. However, polyimide having excellent thermal-resistance shows poor processability while the resin developed for improving processability is poor in resistance to heat and solvents. Thus advantageous characteristics and drawbacks have been found in combination.

For example, polyimide consisting of a fundamental skeleton represented by the formula (II):

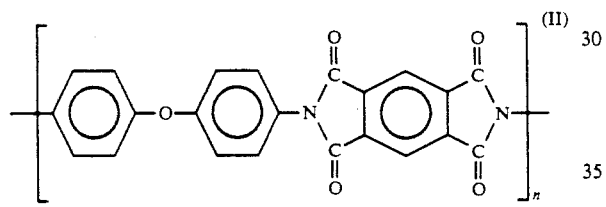

(Trade Mark; Kapton and Vespel, the products of E.I. Du Pont De Nemours & Co. Inc.) has no definite glass transition temperature and is excellent in high-temperature resistance. The polyimide, however, is difficult to process as a molding material and must be processed by specific methods such as sinter molding. The polyimide has also high water absorption which gives adverse effects on dimensional stability, insulative property and solder heat resistance of electric and electronic parts.

Polyetherimide consisting of a fundamental skeleton represented by the formula (III):

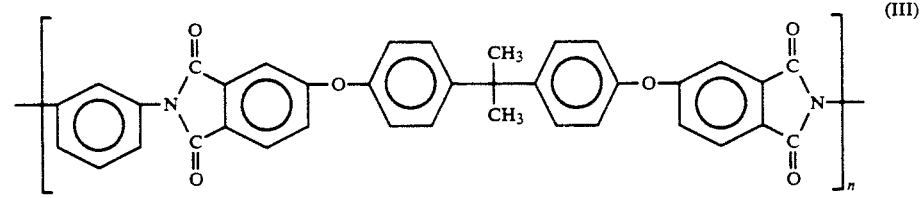

(Trade Mark; ULTEM, a product of General Electric Co.) is a resin having excellent processability. The resin, however, has a relatively low glass transition temperature of 217° C. and is soluble in halogenated hydrocarbons such as methylene chloride. Hence, the resin is unsatisfactory in view of resistance to high temperature and solvents.

SUMMARY OF THE INVENTION

An object of the present invention is to provide polyimide which has, in addition to substantially excellent heat resistance of polyimide, outstanding processability, low water absorption, good transparency, and excellent adhesion at high temperature and can be used for multi-purpose applications.

As a result of carrying out an intensive investigation in order to achieve the above object, the present inventors have found a novel polyimide which is highly heat-resistant and also has good processability.

Accordingly, one aspect of the present invention is a polyimide having recurring structural units represented by the formula (I):

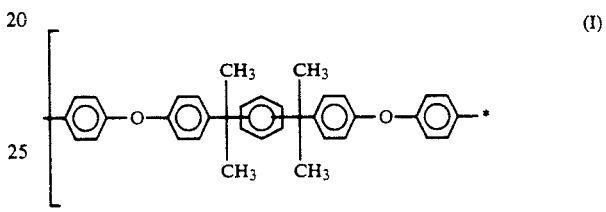

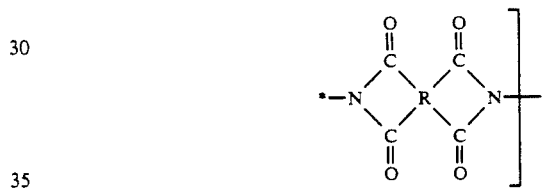

wherein R is a tetravalent radical selected from the group consisting of an aliphatic radical having at least two carbon atoms, alicyclic radical, monocyclic aromatic radical, fused polycyclic aromatic radical and polycyclic aromatic radical bonded through a direct bond or a bridge member.

The polyimide of the invention is a novel polyimide obtained by polymerizing, as a diamine component, 1,4-bis [4-(4-aminophenoxy)-α,α-dimethylbenzyl]benzene and/or 1,3-bis [4-(4-aminophenoxy)-α,α-dimethylbenzyl]benzene having the formula (IV):

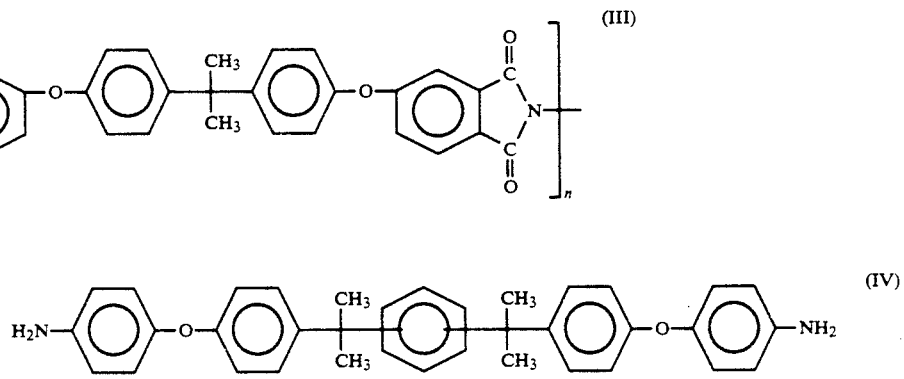

with a single compound or a mixture of tetracarboxylic acid dianhydride.

The polyimide of the invention is characterized by using 1,4-bis [4-(4-aminophenoxy)-α,α-dimethylbenzyl]benzene and/or 1,3-bis [4-(4-aminophenoxy)-α,α-dimethylbenzyl]benzene as a diamine component and is particularly excellent in processability and heat-resistance.

A polyimide obtained by reacting an ether diamine which has a similar structure to the above diamine compound and is illustrated by the formula (V):

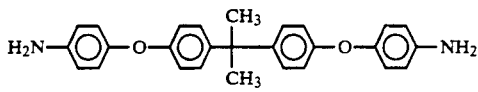
(V)

that is, 2,2-bis [4-(4-aminophenoxy)phenyl]propane, with pyromellitic dianhydride has a high glass transition temperature of 300° C. or more, low melt flowability at high temperatures, very low adhesive strength and poor processability as disclosed in Japanese Patent Laid-Open Publication SHO 61-291669(1986).

The polyimide of the invention is thermoplastic while maintaining excellent heat-resistance and thus has very good processability. These polyimides are highly heat resistant and can be melt-molded.

Further, the polyimide of the invention has low water absorption in addition to the above outstanding processability and is very useful for the base material of space and aeronautical members and electric and electronic parts, and also as a heat-resistant adhesive.

As mentioned above, the polyimide of the present invention is a novel polyimide having excellent processability, low water absorption and good solvent resistance in addition to exhibiting substantially excellent heat resistance.

Consequently, the present invention can provide a novel polyimide which can be used for multi-purpose applications and is very useful in industry.

BRIEF DESCRIPTION OF THE DRAWINGS

The drawings are IR absorption spectra of polyimide of the invention.

FIG. 2 illustrates the IR absorption spectrum of polyimide powder obtained in Example 2.

DETAILED DESCRIPTION OF THE INVENTION

Figure 1:
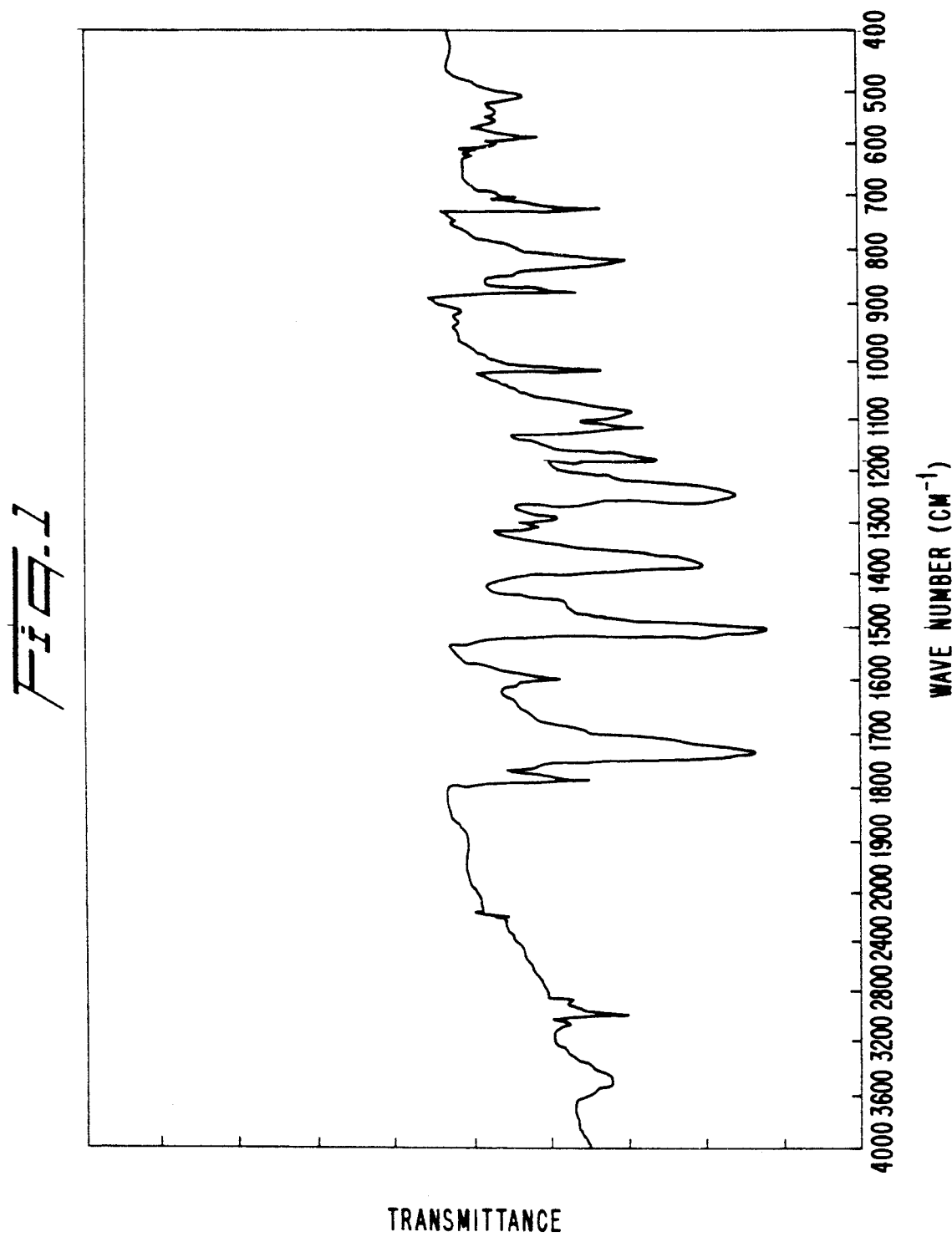
FIG. 1 illustrates the IR absorption spectrum of polyimide powder obtained in Example 1.

The polyimide of the present invention is a polyimide having recurring structural units represented by the formula (I)

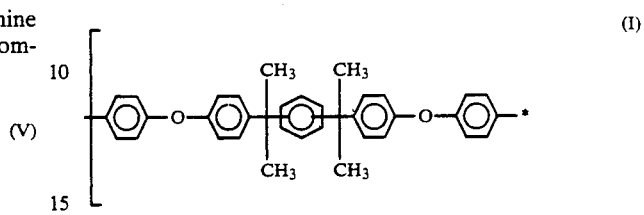
(I)

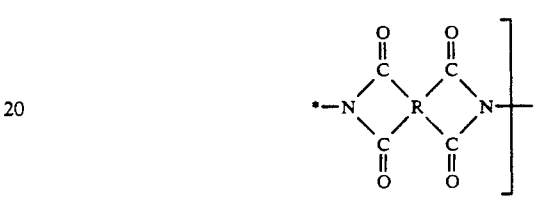

wherein R is the same as above.

For example, preferred polyimides include a polyimide having recurring structural units illustrated by the formula (VI):

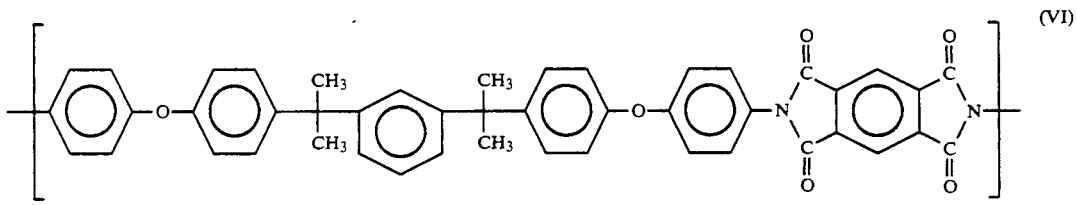
(VI)

or by the formula (VII):

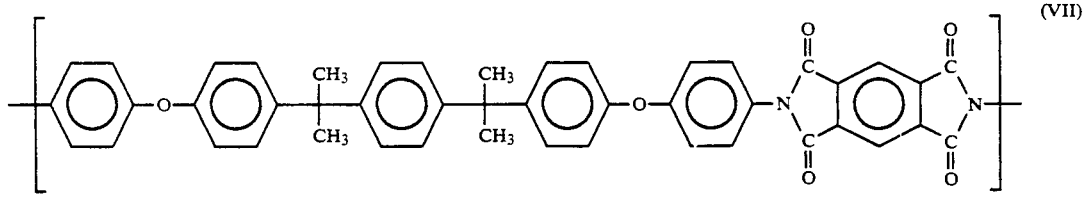
(VII)

The polyimide of the invention uses 1,4-bis[4-(4-aminophenoxy)-α,α-dimethylbenzyl]benzene and/or 1,3-bis[4-(4-aminophenoxy)-α,α-dimethylbenzyl]benzene as diamine components.

The polyimide of the invention is prepared from the above diamine compounds. However, other diamine compounds can also be used combination with the above diamine compounds as long the good properties of the polymide are not impaired. Examples of other aromatic diamines which can be simultaneously used include m-phenylenediamine, o-phenylenediamine, p-phenylenediamine, m-aminobenzylamine, p-aminobenzylamine, bis(3-aminophenyl)ether, (3-aminophenyl)(4-aminophenyl)ether, bis(4-aminophenyl) ether, bis(3-aminophenyl) sulfide, (3-aminophenyl)(4-aminophenyl)sulfide, bis(4-aminophenyl) sulfide, bis(3-aminophenyl) sulfoxide, (3-aminophenyl)(4-aminophenyl) sulfoxide, bis(4-aminophenyl) sulfoxide, bis(3-aminophenyl)sulfone, (3-aminophenyl)(4-aminophenyl)

sulfone, bis(4-aminophenyl) sulfone, 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, bis [4-(3-aminophenoxy)phenyl]methane, bis [4-(4-aminophenoxy)phenyl]methane, 1,1-bis [4-(3-aminophenoxy)phenyl]ethane, 1,1-bis [4-(4-aminophenoxy)phenyl]ethane, 1,2-bis [4-(3-aminophenoxy)phenyl]ethane, 1,2-bis [4-(4-aminophenoxy)phenyl]ethane, 2,2-bis [4-(3-aminophenoxy)phenyl]propane, 2,2-bis [4-(4-aminophenoxy)phenyl]propane, 2,2-bis [4-(3-aminophenoxy)phenyl]butane, 2,2-bis [4-(4-aminophenoxy)phenyl]butane, 2,2-bis [4-(3-aminophenoxy)phenyl]1,1,1,3,3,3-hexafluoropropane, 2,2 bis [4-(4-aminophenoxy)phenyl]1,1,1,3,3,3-hexafluoropropane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 4,4'-bis(3-aminophenoxy)biphenyl, 4,4'-bis(4-aminophenoxy)biphenyl, bis [4-(3-aminophenoxy)phenyl]ketone, bis [4-(4-aminophenoxy)phenyl]ketone, bis [4,(3-aminophenoxy)phenyl]sulfide, bis [4,(4-aminophenoxy)phenyl]sulfide, bis [4-(3-aminophenoxy)phenyl]sulfoxide, bis [4-(4-aminophenoxy)phenyl]sulfoxide, bis [4-(3-aminophenoxy)phenyl]sulfone, bis [4-(4-aminophenoxy)phenyl]sulfone, bis [4-(3-aminophenoxy)phenyl]ether, bis [4-(4-aminophenoxy)phenyl]ether, 1,4-bis [4-(3-aminophenoxy)benzoyl]benzene, 1,3-bis [4-(3-aminophenoxy)benzoyl]benzene, 4,4'-bis [3-(4-aminophenoxy)benzoyl]diphenyl ether, 4,4'-bis [3-(3-aminophenoxy)benzoyl]diphenyl ether, 4,4'-bis [4-(4-amino-α,α-dimethylbenzyl)phenoxy]benzophenone, 4,4'-bis [4-(4-amino-α,α-dimethylbenzyl)phenoxy]diphenyl bis [4-{4-(4-aminophenoxy)phenoxy}phenyl]sulfone and bis [4- {4-(3-aminophenoxy)phenoxy}phenyl]sulfone.

These aromatic diamines are used singly or as a mixture.

The polyimide of the invention can be prepared by the following process.

In the first step, 1,4-bis [4-(4-aminophenoxy)-α,α-dimethylbenzyl]benzene and/or 1,3-bis [4-(4-aminophenoxy)-α,α-dimethylbenzyl]benzene are polymerized with tetracarboxylic acid dianhydride in an organic solvent to obtain polyamic acid.

The tetracarboxylic acid dianhydride used in the process is represented by the formula (VIII):

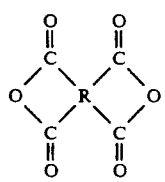
(VIII)

wherein R is a tetravalent radical selected from the group consisting of an aliphatic radical having at least two carbon atoms, alicyclic radical, monocyclic aromatic radical, fused polycyclic aromatic radical and polycyclic aromatic radical bonded through a direct bond or a bridge member.

Exemplary tetracarboxylic acid dianhydrides which can be used include ethylenetetracarboxylic dianhydride, butanetetracarboxylic dianhydride, cyclopentanetetracarboxylic dianhydride, pyromellitic dianhydride, 3,3',4,4'-benzophenonetetracarboxylic dianhydride, 2,2',3,3'-benzophenonetetracarboxylic dianhydride, 1,2,3,4-benzenetetracarboxylic dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 2,2-bis(3,4-dicarboxyphenyl)-1,1,1,3,3,3-hexachloropropane dianhydride, bis(3,4-dicarboxyphenyl)ether dianhydride, bis(2,3-dicarboxyphenyl)ether dianhydride, bis(3,4-dicarboxyphenyl)sulfone dianhydride, bis(2,3-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, bis [4-(3,4-dicarboxyphenoxy)phenyl]sulfide, 3,3'-(p-phenylenedioxy)diphthalic dianhydride, 4,4'-(p-phenylenedioxy)diphthalic dianhydride, 3,3'-(m-phenylenedioxy)diphthalic dianhydride and 4,4'-(m-phenylenedioxy)diphthalic dianhydride.

The tetracarboxylic acid dianhydride is used singly or in combination.

Exemplary organic solvents for use in the reaction include N,N-dimethylformamide, N,N-dimethylacetamide, N,N-diethylacetamide, N,N-dimethylmethoxyacetamide, N-methyl-2-pyrrolidone, 1,3-dimethyl-2-imidazolidinone, N-methylcaprolactam, 1,2-dimethoxyethane bis(2-methoxyethyl)ether, 1,2-bis(2-methoxyethoxy)ethane, bis [2-(2-methoxyethoxy)ethyl]ether, tetrahydrofuran, 1,3-dioxane, 1,4-dioxane, pyridine, picoline, dimethyl sulfoxide, dimethyl sulfone, tetramethylurea, hexamethylphosphoramide, phenol, o-cresol, m-cresol, p-cresol, m-cresylic acid, p-chlorophenol and anisole.

The organic solvent can be used singly or as a mixture.

The reaction temperature is usually 250° C. or less, preferably 50° C. or less.

No particular limitation is imposed upon the reaction pressure.

The reaction can be satisfactorily carried out under atmospheric pressure. The reaction time varies depending upon tetracarboxylic acid anhydride used, kind of solvent and reaction temperature. The reaction is usually conducted for a time sufficient to complete formation of polyamic acid represented by the formula (IX) below. A reaction time of 4 to 24 hours is usually sufficient.

By the reaction, polyamic acid, having recurring structural units represented by the formula (IX) is formed.

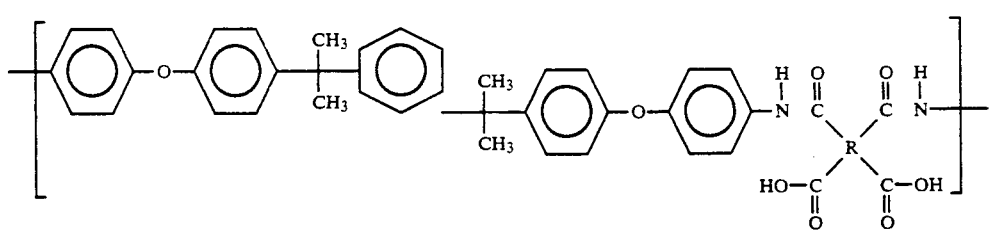

wherein R is the same as above. The polyamic acid is heat-dehydrated at 100° to 400° C., or chemically imidized by using a conventional imidizing agent to give the corresponding polyimide having recurring structural units of the formula (I):

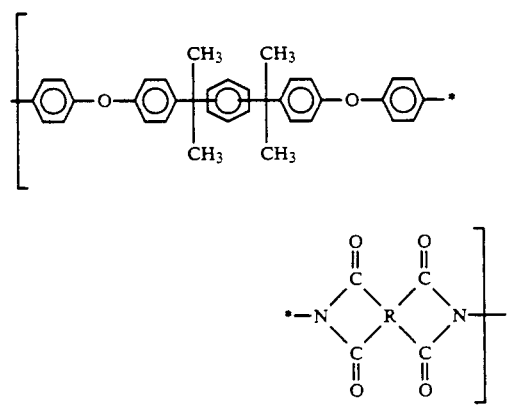

wherein R is the same as above.

Generally, polyamic acid is formed at lower temperatures and then thermally or chemically imidized.

Polyimide can also be prepared by simultaneously carrying out formation of polyamic acid and imidization by heat. That is, 1,4-bis [4-(4-aminophenoxy)-α,α-dimethylbenzyl]benzene and/or 1,3-bis [4-(4-aminophenoxy)-α,α-dimethylbenzyl]benzene are reacted with tetracarboxylic acid anhydride by heating after suspending or dissolving in the organic solvent. Thus, formation of polyamic acid and imidization by dehydration are conducted at the same time to obtain the polyimide having recurring structural units of the above formula (I).

In the practice of the above reaction, a dicarboxylic acid anhydride and/or a monoamine compound are sometimes added as a molecular weight controller or a chain terminator.

No particular limitation is placed upon the amount of dicarboxylic acid anhydride and/or the monoamine compound. The amount added is usually from 0.001 mole to 1.0 mole per mole of principal raw material monomer.

The reaction in the presence of the dicarboxylic acid anhydride and/or the monoamine compound can be carried out by any of the following methods.

(a) Tetracarboxylic acid dianhydride is reacted with 1,4-bis [4-(4-aminophenoxy)-α,α-dimethylbenzyl]benzene and/or 1,3-bis [4-(4-aminophenoxy)-α,α-dimethylbenzyl]benzene, followed by adding dicarboxylic acid anhydride and/or the monoamine compound and the reaction is further continued.

(b) 1,4-Bis [4-(4-aminophenoxy)-α,α-dimethylbenzyl]-benzene and/or 1,3-bis [4-(4-aminophenoxy)-α,α-dimethylbenzyl]-benzene are reacted with dicarboxylic acid anhydride and then tetracarboxylic dianhydride is added to continue the reaction.

(c) Tetracarboxylic acid dianhydride is previously reacted with the monoamine compound and then 1,4-bis [4-(4-aminophenoxy)-α,α-dimethylbenzyl]-benzene and/or 1,3-bis [4-(4-aminophenoxy)-α,α-dimethylbenzyl]-benzene are added to continue the reaction.

(d) The reaction is conducted by simultaneous mixing 1,4-bis [4-(4-aminophenoxy)-α,α-dimethylbenzyl]-benzene and/or 1,3-bis (4-(4-aminophenoxy)-α,α-dimethylbenzyl]-benzene, tetracarboxylic acid dianhydride, and dicarboxylic acid anhydride and/or the monoamine compound.

Alternatively, 1,4-bis [4-(4-aminophenoxy)-α,α-dimethylbenzyl]benzene and/or 1,3-bis [4-(4-aminophenoxy)-α,α-dimethylbenzyl]benzene, tetracarboxylic acid dianhydride, and dicarboxylic acid anhydride and/or the diamine compound are suspended or dissolved in the organic solvent and heated to carry out the reaction. Thus polyimide can also be prepared by conducting the formation of polyamic acid, i.e., the precursor of polyimide, and imidization at the same time.

Exemplary dicarboxylic acid anhydrides suitable for use in the above methods include phthalic anhydride, 2,3-benzophenonedicarboxylic anhydride, 3,4-benzophenonedicarboxylic anhydride, 2,3-dicarboxyphenylphenyl ether anhydride, 3,4-dicarboxyphenylphenyl ether anhydride, 2,3-biphenyldicarboxylic anhydride, 3,4-biphenyldicarboxylic anhydride, 2,3-dicarboxyphenylphenyl sulfone anhydride, 3,4-dicarboxyphenylphenyl sulfone anhydride, 2,3-dicarboxyphenylphenyl sulfide anhydride, 3,4-dicarboxyphenylphenyl sulfide anhydride, 1,2-naphthalenedicarboxylic anhydride, 2,3-naphthalenedicarboxylic anhydride, 1,8-naphthalenedicarboxylic anhydride, 1,2-anthracenedicarboxylic anhydride, 2,3-anthracenedicarboxylic anhydride and 1,9-anthracenedicarboxylic anhydride.

Exemplary monoamine compounds which can be used in the reaction includes aniline, o-toluidine, m-toluidine, p-toluidine, 2,3-xylidine, 2,4-xylidine, 2,5-xylidine, 2,6-xylidine, 3,4-xylidine, 3,5-xylidine, o-chloroaniline, m-chloroaniline, p-chloroaniline, o-bromoaniline, m-bromoaniline, p-bromoaniline, o-nitroaniline, m-nitroaniline, p-nitroaniline, o-aminophenol, m-aminophenol, p-aminophenol, o-anisidine, m-anisidine, p-anisidine, o-phenetidine, m-phenetidine, p-phenetidine, o-aminobenzaldehyde, m-aminobenzaldehyde, p-aminobenzaldehyde, o-aminobenzotrifluoride, m-aminobenzotrifluoride, p-aminobenzotrifluoride, o-aminobenzonitrile, m-aminobenzonitrile, p-aminobenzonitrile, 2-aminobiphenyl, 3-aminobiphenyl, 4-aminobiphenyl, 2-aminophenyl phenyl ether, 3-aminophenyl phenyl ether, 4-aminophenyl phenyl ether, 2-aminobenzophenone, 3-aminobenzophenone, 4-aminobenzophenone, 2-aminophenyl phenyl sulfide, 3-aminophenyl phenyl sulfide, 4-aminophenyl phenyl sulfide, 2-aminophenyl phenyl sulfone, 3-aminophenyl phenyl sulfone, 4-aminophenyl phenyl sulfone, α-naphthylamine, β-naphthylamine, 1-amino-2-naphthol, 2-amino-1-naphthol, 4-amino-1-naphthol, 5-amino-1-naphthol, 5-amino-2-naphthol, 7-amino-2-naphthol, 8-amino-1-naphthol, 8-amino-2-naphthol, 1-aminoanthracene, 2-aminoanthracene and 9-aminoanthracene.

That is, the polyimide having recurring structural units of the above formula (I) can be obtained by using conventionally known methods.

In the melt-molding of the polyimide of the invention, other thermoplastic resins can also be incorporated in a suitable amount depending upon the object as long as the resin gives no adverse effects on the objects of the invention.

Examples of the thermoplastic resins which can be used include, polyethylene, polypropylene, polycarbonate, polyarylate, polyamide, polysulfone, polyether sulfone, polyether ketone, polyphenylene sulfide, polyamideimide, polyetherimide and modified polyphenylene oxide.

Fillers used for a conventional resin compositions can also be added in an amount giving no adverse effects on the objects of the invention. Representative examples of the fillers include abrasion resistance improvers such as graphite, carborundum, quartz powder, molybdenum disulfide, and fluoro plastics; reinforcements such as glass fibers, carbon fibers, boron fibers, silicon carbide fibers, carbon whiskers, asbestos, metallic fibers and ceramic fibers; flame retardants such as antimony trioxide, magnesium carbonate and calcium carbonate; electrical property improvers such as clay and mica; antitracking agents such as asbestos, silica and graphite; acid resistance improvers such as barium sulfate, silica and calcium metasilicate; heat conductivity improvers such as iron powder, zinc powder, aluminum powder and copper powder; and other miscellaneous fillers such as glass beads, glass spheres, talc, diatomaceous earth, alumina, silicate balloons, hydrated alumina, metal oxide and colorants.

The present invention will hereinafter be illustrated further in detail by way of synthesis examples, examples and comparative examples.

SYNTHESIS EXAMPLE 1

A reaction vessel equipped with a stirrer, reflux condenser thermometer, water separator and a nitrogen inlet tube was charged with 1410 g of dehydrated N,N-dimethylformamide, 207.6 g (0.6 mole) of 1,4 bis(4-hydroxy-α,α-dimethylbenzyl)benzene, 193.7 g (1.23 mole) of 4-chloronitrobenzene and 248.8 g (1.8 mole) of potassium carbonate, and 50 g of toluene was added. The resulting mixture was heated to 140° to 150° C. and reacted for 5 hours with stirring at the temperature. Water formed by the reaction was successively removed by azeotropic distillation with toluene.

After finishing the reaction, the reaction mixture was filtered to remove inorganic salts. The filtrate was heated to 90° to 9520 C. and 210 g water was added dropwise over 2 hours to crystallize 1,4-bis[4-(4-nitrophenoxy)-α,α-dimethylbenzyl]benzene. The mixture was gradually cooled and the light yellow crystal was filtered, washed with a mixture of N,N-dimethylformamide and methanol, reslurried with 1 l of methanol, filtered and dried to obtain 335 g of light yellow powder. The purity was 99.3% as determined by high performance liquid chromatography. Melting point was 186.5°–188.520 C. Elemental analysis

|  | C | N | H |
| --- | --- | --- | --- |
| Calculated (%) | 73.47 | 4.76 | 5.44 |
| Found (%) | 73.28 | 4.96 | 5.56 |

To a sealed reduction vessel equipped with a stirrer and a thermometer, 294 g (0.5 mole) of above obtained 1,4-bis[4-(4-nitrophenoxy)-α,α-dimethylbenzyl]benzene, 1175 g of N,N-dimethylformamide and 17.5 g of 5% Pd/C catalyst were charged and hydrogen gas was introduced with vigorous stirring. The reaction was carried out at 30° to 40° C. for 4 hours and 67.2 l of hydrogen was absorbed. The reaction was terminated because no more hydrogen was absorbed.

The reaction mixture was filtered to remove the Pd/C catalyst The filtrate was heated to 80° to 90° C. and 500 g of water was added dropwise over 2.5 hours at the temperature to crystallize 1,4-bis [4-(4-aminophenoxy)-α,α-dimethylbenzyl]benzene.

The mixture was gradually cooled and the precipitated white crystals were filtered, washed with a mixture of N,N-dimethylformamide and methanol, washed with methanol and dried to obtain 252.8 g of 1,4-bis [4-(4-aminophenoxy)-α,α-dimethylbenzyl]benzene. The purity was 99.2% by high performance liquid chromatography. The overall yield was 88.3%. Melting point was 189°–190.5° C.

|  | C | N | H |
| --- | --- | --- | --- |
| Calculated (%) | 81.82 | 5.30 | 6.82 |
| Found (%) | 81.90 | 5.21 | 6.75 |

IR (KBr tablet method);
1620, 3320–3430 cm$^{-1}$ (amino group)
1230 cm$^{-1}$ (ether linkage)

SYNTHESIS EXAMPLE 2

A reaction vessel equipped with a stirrer, reflux condenser, thermometer, water separator and a nitrogen inlet tube was charged with 600 g of dehydrated N,N-dimethylformamide, 207.6 g (0.6 mole) of 1,3-bis(4-hydroxy-α,α-dimethylbenzyl)benzene, 193.7 g (1.23 mole) of 4-chloronitrobenzene and 248.8 g (1.8 mole) of potassium carbonate, and 50 g of toluene was added. The resulting mixture was heated to 140° to 150° C. and reacted for 5 hours with stirring at the temperature. Water formed by the reaction was successively removed by azeotropic distillation with toluene.

After finishing the reaction, the reaction mixture was filtered to remove inorganic salts. The filtrate was heated to 90° to 95° C. and 210 g of water was added dropwise over 2 hours to crystallize 1,3 bis [4-(4-nitrophenoxy)-α,α-dimethylbenzyl]benzene. The mixture was gradually cooled and the light yellow crystals were filtered, washed with a mixture of N,N dimethylformamide and methanol, reslurried with 1 l of methanol, filtered and dried to obtain 328 g of light yellow powder. The purity was 99.1% by high performance liquid chromatography.

Melting point was 154.5°–156° C.

|  | C | N | H |
| --- | --- | --- | --- |

|  | C | N | H |
|---|---|---|---|
| Calculated (%) | 73.47 | 4.76 | 5.44 |
| Found (%) | 73.34 | 4.79 | 5.20 |
| IR (KBr tablet method) | | | |
| 1330, 1490 cm$^{-1}$ (nitro group) | | | |
| 1230 cm$^{-1}$ (ether linkage) | | | |

To a reaction vessel equipped with a stirrer, thermometer, reflux condenser and a dropping funnel, 294 g (0.5 mole) of 1,3-bis [4-(4 nitrophenoxy)-α,α-dimethylbenzyl]benzene, 1500 g of methoxyethanol, 29.4 g of activated carbon and 2.9 g of ferric chloride hexahydrate were charged and stirred for 3 hours at 100° to 150° C. Thereafter 150.2 g of 80% hydrazine monohydrate was added dropwise over 3 hours while stirring.

After aging for an hour at the same temperature, solid material was removed by hot-filtration. The filtrate was concentrated and recrystallized from isopropyl alcohol to obtain the desired 1,3-bis [4-(4-aminophenoxy)-α,α-dimethylbenzyl]benzene as white crystals.

The white crystals were filtered, washed with isopropyl alcohol and dried to obtain 228.5 g of 1,3-bis [4-(4-aminophenoxy)-α,α-dimethylbenzyl]benzene. The purity was 99.0% by high performance liquid chromatography. The overall yield was 81.5%.

Melting point was 103°–105.5° C.

|  | C | N | H |
|---|---|---|---|
| Calculated (%) | 81.82 | 5.30 | 6.82 |
| Found (%) | 81.86 | 5.22 | 6.45 |
| IR (KBr tablet method); | | | |
| 1620, 1340-1440 cm$^{-1}$ (amino group) | | | |
| 1240 cm$^{-1}$ (ether linkage) | | | |

EXAMPLE 1

To a reaction vessel equipped with a stirrer, reflux condenser, water separator and a nitrogen inlet tube, 15.84 g (0.03 mole) of 1,4-bis [4-(4 aminophenoxy)-α,α-dimethylbenzyl]benzene, 6.213 g (0.0285 mole) of pyromellitic dianhydride, 0.444 g (3×10$^-$mole) of phthalic anhydride, 0.83 g of γ-picoline and 208 g of m-cresol were charged and heated to 145° C. with stirring in a nitrogen atmosphere.

During the time, about 1 ml of water was distilled out. The reaction was carried out at 140' to 150° C. for 4 hours. The reaction mixture was cooled to room temperature and poured into about 1000 g of methyl ethyl ketone. The precipitated polyimide powder was filtered, washed with methyl ethyl ketone and dried at 180° C. for 24 hours under reduced pressure. The polyimide powder thus obtained was 21.2 g (98.5% yield) and had an inherent viscosity of 0.77 dl/g.

The inherent viscosity was measured at 35° C. after heat-dissolving 0.5 g of polyimide powder in 100 ml of a solvent mixture of p-chlorophenol/phenol in a ratio of 9/1 by weight. The polyimide had a glass transition temperature of 246° C., melting point of 340° C. (measured by DSC method), and a 5% weight loss temperature of 530° C. in air (measured by DTA-TG method).

The IR absorption spectrum diagram of the polyimide powder is illustrated in FIG. 1. In the diagram, remarkable absorptions are found at around 1780 cm$^{-1}$ and 1720 cm$^{-1}$ which are characteristic absorption bands of imide group and around 1240 cm$^{-1}$ which is a characteristic absorption band of the ether linkage.

Results of elemental analysis on the polyimide powder thus obtained were as follows.

|  | C | N | H |
|---|---|---|---|
| Calculated (%) | 77.83 | 3.92 | 4.80 |
| Found (%) | 77.86 | 3.93 | 4.77 |

The polyimide powder was quite insoluble in halogenated hydrocarbon solvents such as methylene chloride and chloroform.

Melt viscosity of the polyimide powder thus obtained was measured with a KOKA-model flow tester (CFT-500, a product of Shimadzu Seisakusho Co. Ltd.) under load of 100 kg by using an orifice of 0.1 cm in diameter and 1 cm in length. The melt viscosity was 13200 poise at 400° C. and 7600 poise at 420° C. The strands obtained were red brown and transparent and had a high flexibility.

COMPARATIVE EXAMPLE 1

Commercially available pellets of ULTEM 1000 (Trade Mark of General Electric Co. Ltd.) having the formula (III) were dissolved in methylene chloride. The solubility was 20% by weight or more.

EXAMPLE 2

The same procedures as described in Example 1 were carried out using 1,3-bis [4-(4-aminophenoxy)-α,α-dimethylbenzyl}benzene in place of 1,4-bis [4-(4-aminophenoxy)-α,α-dimethylbenzyl]benzene.

The polyimide powder thus obtained was 21.1 g (98% yield) and had an inherent viscosity of 0.56 dl/g.

The polyimide powder had a glass transition temperature of 236° C., melting point of 292° C., and a 5% weight loss temperature of 528° C. in air.

The IR absorption spectrum diagram of the polyimide powder is illustrated in FIG. 2. In the diagram, remarkable absorptions are found at around 1780 cm$^{-1}$ and 1720 cm$^{-1}$ which are characteristic absorption bands of imide group and around 1240 cm$^{-1}$ which is a characteristic absorption band of the ether linkage.

Results of elemental analysis on the polyimide powder thus obtained were as follows.

|  | C | N | H |
|---|---|---|---|
| Calculated (%) | 77.83 | 3.92 | 4.80 |
| Found (%) | 77.80 | 3.90 | 4.82 |

EXAMPLE 3

To a reaction vessel equipped with a stirrer, reflux condenser and a nitrogen inlet tube, 5.28 g (0.01 mole) of 1,4-bis [4-(4-aminophenoxy)-α,α-dimethylbenzyl]benzene and 42.27 g of N,N-dimethylacetamide were charged. In a nitrogen atmosphere, 2.16 g (0.099 mole) of pyromellitic dianhydride was added by portions at room temperature with caution to prevent temperature rise of the solution. The mixture was stirred for 20 hours at the room temperature. The polyamic acid thus obtained had an inherent viscosity of 1.86 dl/g.

The inherent viscosity was measured at 35° C. with a N,N-dimethylacetamide solution in a concentration of 0.5 g/100 ml solvent.

A portion of the polyamic acid solution was cast on a glass plate and heated for an hour at 100° C., 200° C. and 300° C., respectively. The polyimide film obtained had a thickness of about 25 μm.

The polyimide film had a tensile strength of 13.8 kg/mm² and an elongation of 8.0% in accordance with ASTM D-882 and a glass transition temperature of 257° C. which is measured by a TMA penetration method. Further, the film had a water absorption of 0.62% after immersing into water at 23.5° C. for 24 hours in accordance with ASTM D570-63.

COMPARATIVE EXAMPLE 2

As a result of measuring water absorption by carrying out the same procedures as described in Example 3, commercially available Kapton 100 H (Trad Mark of E.I. Du Pont De Nemours & Co. Inc.) had a water absorption of 2.9%.

EXAMPLE 4

The same procedures as described in Example 3 were carried out except that
1,4-bis [4-(4-aminophenoxy)-α,α-dimethylbenzyl]benzene was replaced by
1,3-bis [4-(4-aminophenoxy)-α,α-dimethylbenzyl]benzene.

The polyamic acid thus obtained had an inherent viscosity of 1.75 dl/g.

A portion of the polyamic acid solution was cast on a glass plate and heated for an hour at 100° C., 200° C. and 300° C., respectively. The polyimide film thus obtained had a thickness of about 25 μm.

The polyimide film also had a tensile strength of 12.0 kg/mm², elongation of 6.9%, glass transition temperature of 245° C. and water absorption of 0.68%.

EXAMPLES 5-12

The same procedures as described in Examples 3 and 4 were carried out by changing the kind of tetracarboxylic acid dianhydride to obtain polyimide films.

Properties of the polyimide films thus obtained are summarized in Table 1 together with those of Examples 3 and 4.

TABLE 1

| | | | | Polyimide film | | | |
|---|---|---|---|---|---|---|---|
| Example No. | Diamine compound g (mole) | Tetracarboxylic acid dianhydride g (mole) | Polyamic acid inherent viscosity (dl/g) | Glass transition temperature (°C.) | Tensile strength (kg/mm²) | Elongation (%) | water absorption (%) |
| 3 | A (Note) 5.28 (0.01) | pyromellitic dianhydride 2.16 (0.0099) | 1.86 | 257 | 13.8 | 11.0 | 0.62 |
| 4 | B (Note) 5.28 (0.01) | pyromellitic dianhydride 2.16 (0.0099) | 1.75 | 245 | 12.0 | 6.0 | 0.68 |
| 5 | A (Note) 5.28 (0.01) | 3,3',4,4'-biphenyltetracarboxylic dianhydride 2.91 (0.0099) | 1.55 | 239 | 12.3 | 9.5 | 0.52 |
| 6 | A 5.28 (0.01) | 3,3',4,4'-benzophenonetetracarboxylic dianhydride 3.19 (0.0099) | 1.20 | 227 | 14.1 | 7.2 | 0.60 |
| 7 | A 5.28 (0.01) | (3,4-dicarboxyphenyl) ether dianhydride 3.07 (0.0099) | 1.45 | 204 | 13.1 | 8.7 | 0.50 |
| 8 | A 5.28 (0.01) | 4,4'-(p-phenylenedioxy)diphthalic dianhydride 3.91 (0.0099) | 1.60 | 201 | 14.5 | 10.6 | 0.44 |
| 9 | B 5.28 (0.01) | 3,3',4,4'-biphenyltetracarboxylic dianhydride 2.91 (0.0099) | 1.50 | 228 | 10.7 | 10.0 | 0.57 |
| 10 | B 5.28 (0.01) | 3,3',4,4'-benzophenone tetracarboxylic dianhydride 3.19 (0.0099) | 1.15 | 216 | 12.7 | 4.9 | 0.61 |
| 11 | B 5.28 (0.01) | (3,4-dicarboxyphenyl)ether dianhydride 3.07 (0.0099) | 1.40 | 199 | 11.4 | 7.7 | 0.56 |
| 12 | B 5.28 (0.01) | 4,4'-(p-phenylenedioxy)diphthalic dianhydride 3.98 (0.0099) | 1.50 | 195 | 12.7 | 9.2 | 0.49 |

(Note)
A: 1,4-bis [4-(4-aminophenoxy)-α,α-dimethylbenzyl] benzene
B: 1,3-bis [4-(4-aminophenoxy)-α,α-dimethylbenzyl] benzene

What is claimed is:
1. A polyimide having recurring structural units represented by the formula (I):

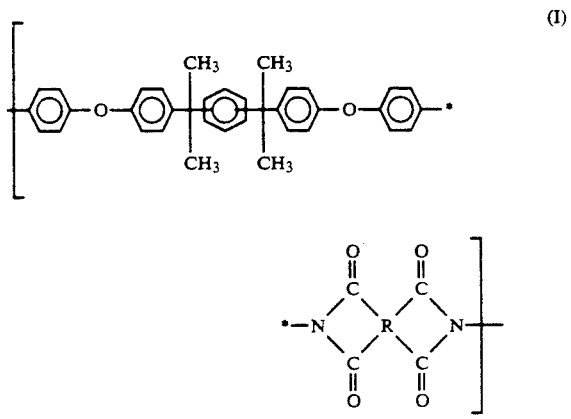

wherein R is a tetravalent radical selected from the group consisting of an aliphatic radical having at least two carbon atoms, alicyclic radical, monocyclic aromatic radical, fused polycyclic aromatic radical and polycyclic aromatic radical bonded through a direct bond or a bridge member.

2. A polyimide having recurring structural units of the formula (VI):

3. A polyimide having the recurring structural units of the formula (VII):

4. A polyimide having recurring structural units represented by the formula (I):

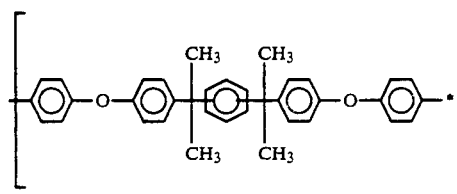
(I)

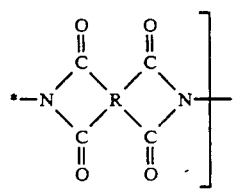

wherein R is a tetravalent radical selected from the group consisting of an aliphatic radical having at least two carbon atoms, alicyclic radical, monocyclic aromatic radical, fused polycyclic aromatic radical and polycyclic aromatic radical bonded through a direct bond or a bridge member, obtained by polymerizing at least one of 1,4-bis[4-(4-aminophenoxy)-α,α-dimethylbenzyl]benzene and 1,3-bis[4-(4-aminophenoxy-α,α-aminophenoxy)-α,αdimethylbenzyl]benzene with at least one tetracarboxylic acid dianhydride of the formula

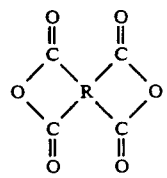

in the presence of a chain terminator which is at least one of a dicarboxylic acid anhydride and a monoamine compound.

5. The polyimide of claim 4 wherein the amount of the dicarboxylic acid anhydride from 0.001 to 1.0 mole per mole of the 1,4-bis[4-(4-aminophenoxy)-α,α-dimethylbenzyl) benzene and 1,3-bis[4-(4-aminophenoxy-α,α-aminophenoxy)-α,α-dimethylbenzyl]benzene.

6. The polyimide of claim 4 wherein the amount of the monoamine compound is from 0.001 to 1.0 mole per mole of the tetracarboxylic acid dianhydride.

* * * * *

UNITED STATES PATENT AND TRADEMARK OFFICE
CERTIFICATE OF CORRECTION

PATENT NO. : 5,196,506

DATED : March 23, 1993

INVENTOR(S) : Tamai et al

It is certified that error appears in the above-indentified patent and that said Letters Patent is hereby corrected as shown below:

On the title page: Item [54] and Column 1, line 2, "POLYMIDE" to --POLYIMIDE--.

Column 15, line 9, add formula (VI) as follows:

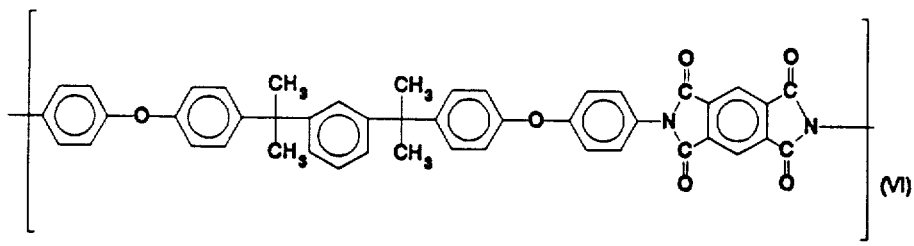

UNITED STATES PATENT AND TRADEMARK OFFICE
CERTIFICATE OF CORRECTION

PATENT NO. : 5,196,506

DATED : March 23, 1993

INVENTOR(S) : Tamai et al

It is certified that error appears in the above-indentified patent and that said Letters Patent is hereby corrected as shown below:

Column 15, line 11, add formula (VII) as follows:

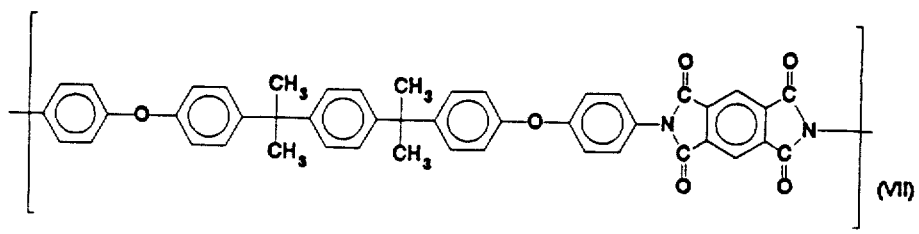

Column 16, line 9, amend "α,α-dimethylbenzyl]benzene" to --α,α-dimethylbenzyl] benzene--.

Column 16, line 28, amend "dimethylbenzyl]benzene" to --dimethylbenzyl] benzene--.

Signed and Sealed this

First Day of March, 1994

Attest:

BRUCE LEHMAN

*Attesting Officer*     *Commissioner of Patents and Trademarks*